(12) United States Patent
Herberholz

(10) Patent No.: US 11,307,244 B2
(45) Date of Patent: Apr. 19, 2022

(54) ADAPTIVE VOLTAGE SCALING METHODS AND SYSTEMS THEREFOR

(71) Applicant: Arm Limited, Cambridge (GB)

(72) Inventor: Rainer Herberholz, Great Abington (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/648,500

(22) PCT Filed: Sep. 28, 2018

(86) PCT No.: PCT/GB2018/052771
§ 371 (c)(1),
(2) Date: Mar. 18, 2020

(87) PCT Pub. No.: WO2019/069056
PCT Pub. Date: Apr. 11, 2019

(65) Prior Publication Data
US 2020/0225281 A1 Jul. 16, 2020

(30) Foreign Application Priority Data
Oct. 2, 2017 (GB) ...................................... 1716083

(51) Int. Cl.
*G01R 31/28* (2006.01)
*H03K 5/134* (2014.01)
*G06F 1/3296* (2019.01)
*H03K 3/03* (2006.01)
(Continued)

(52) U.S. Cl.
CPC ....... *G01R 31/2884* (2013.01); *G06F 1/3296* (2013.01); *H03K 3/0315* (2013.01); *H03K 5/134* (2014.07); *H03K 19/0013* (2013.01); *H03K 19/20* (2013.01)

(58) Field of Classification Search
USPC .......................................... 326/104, 108, 112
See application file for complete search history.

(56) References Cited

U.S. PATENT DOCUMENTS 5,828,614 A * 10/1998 Gradinariu ............ G11C 11/419
365/207
6,081,149 A * 6/2000 Veendrick ............. H04L 7/0083
327/295
(Continued)

FOREIGN PATENT DOCUMENTS

JP 2010109115 A * 5/2010
JP 2010109115 A 5/2010

OTHER PUBLICATIONS

European Patent Office, PCT/GB2018/052771, International Search Report and Written Opinion, dated Dec. 7, 2018.
(Continued)

*Primary Examiner* — Adam D Houston
(74) *Attorney, Agent, or Firm* — Leveque Intellectual Property Law, P.C.

(57) ABSTRACT

The present techniques disclose a logic gate for an adaptive voltage scaling monitor, the logic gate comprising an inverting output and further comprising an imbalance between the drive strength of an NMOS component and a PMOS component thereof, and wherein the imbalance is operable to cause a switching delay of the gate to be primarily dependent on one of the NMOS component or the PMOS component.

18 Claims, 13 Drawing Sheets

(51) Int. Cl.
*H03K 19/00* (2006.01)
*H03K 19/20* (2006.01)

(56) References Cited

U.S. PATENT DOCUMENTS

| | | | | |
|---|---|---|---|---|
| 6,317,381 B1* | 11/2001 | Gans | ........................ | G11C 8/18 |
| | | | | 365/194 |
| 6,597,199 B1* | 7/2003 | Bui | ...................... | H03K 17/164 |
| | | | | 327/170 |
| 6,657,467 B2* | 12/2003 | Seki | ...................... | H03L 7/0805 |
| | | | | 327/27 |
| 7,061,292 B2* | 6/2006 | Maksimovic | ......... | H02M 3/157 |
| | | | | 327/540 |
| 9,893,621 B1* | 2/2018 | Newlin | .................... | H03K 7/08 |
| 10,298,247 B1* | 5/2019 | Frew | ...................... | H03M 1/60 |
| 10,445,206 B2* | 10/2019 | Igarashi | ............... | G11C 29/025 |
| 2001/0050585 A1* | 12/2001 | Carr | ........................ | G11C 7/222 |
| | | | | 327/277 |
| 2002/0130686 A1 | 9/2002 | Forbes | | |
| 2003/0153140 A1* | 8/2003 | Keeth | .................. | G11C 7/1078 |
| | | | | 438/200 |
| 2007/0013425 A1* | 1/2007 | Burr | .................... | G11C 11/4125 |
| | | | | 327/208 |
| 2007/0046362 A1 | 3/2007 | Gammie et al. | | |
| 2007/0096814 A1* | 5/2007 | Chiu | .................... | H03F 3/45197 |
| | | | | 330/253 |
| 2007/0252638 A1* | 11/2007 | Aquil | ................... | H03K 19/00384 |
| | | | | 327/513 |
| 2008/0270049 A1* | 10/2008 | Kim | ................... | G01R 31/31937 |
| | | | | 702/58 |
| 2012/0146672 A1 | 6/2012 | Winter et al. | | |
| 2012/0326701 A1* | 12/2012 | Chen | .................... | H03K 3/0315 |
| | | | | 324/76.12 |
| 2013/0103988 A1* | 4/2013 | Ishimi | ...................... | H03L 7/00 |
| | | | | 714/47.1 |
| 2013/0234770 A1* | 9/2013 | Yonezawa | ...... | G01R 31/318594 |
| | | | | 327/261 |
| 2014/0043008 A1* | 2/2014 | Babazadeh | ........... | H02M 3/156 |
| | | | | 323/304 |
| 2014/0197895 A1* | 7/2014 | Chen | .................... | H03K 3/0315 |
| | | | | 331/57 |
| 2014/0354461 A1* | 12/2014 | Kawano | ................ | H03M 1/502 |
| | | | | 341/155 |
| 2015/0085586 A1* | 3/2015 | Zheng | .................. | G11C 7/1096 |
| | | | | 365/189.02 |
| 2015/0323951 A1* | 11/2015 | Huang | ................... | G11C 5/148 |
| | | | | 327/543 |
| 2016/0126840 A1* | 5/2016 | Kelly | .................... | H02M 3/157 |
| | | | | 323/271 |
| 2016/0126908 A1* | 5/2016 | King | ...................... | H03F 3/181 |
| | | | | 330/251 |
| 2016/0147245 A1* | 5/2016 | Kundu | .................... | G05F 3/262 |
| | | | | 327/541 |
| 2016/0156342 A1* | 6/2016 | Yun | ........................ | H03L 7/085 |
| | | | | 327/158 |
| 2017/0039309 A1* | 2/2017 | Wang | .................... | G06F 30/367 |
| 2018/0198461 A1* | 7/2018 | Kris | ........................ | H03M 1/34 |
| 2018/0246159 A1* | 8/2018 | Huynh | ................ | G01R 31/129 |
| 2018/0254081 A1* | 9/2018 | Mohammadi | ............ | G11C 8/10 |
| 2019/0089341 A1* | 3/2019 | Nagayama | ............ | G06F 1/3237 |
| 2019/0131945 A1* | 5/2019 | Lakshmikumar | .... | H03G 1/0088 |
| 2020/0083900 A1* | 3/2020 | Shabra | .................. | H03M 3/42 |
| 2020/0112241 A1* | 4/2020 | Wang | .................... | H02M 1/08 |
| 2020/0153449 A1* | 5/2020 | Snoeij | ........................ | H03L 7/18 |
| 2020/0225281 A1* | 7/2020 | Herberholz | .......... | H03K 3/0315 |
| 2020/0379032 A1* | 12/2020 | Höppner | ............ | G06F 30/3312 |

OTHER PUBLICATIONS

Notani et al. "On-chip digital Idn and Idp measurement by 65 nm CMOS speed monitor circuit." 2008 IEEE Asian Solid-State Circuits Conference (2008): 405-408.

Tetsuya et al.. "All-Digital PMOS and NMOS Process Variability Monitor Utilizing Shared Buffer Ring and Ring Oscillator." IEICE Trans. Electron, vol. E95-C, No. 4, Apr. 2012.

Harris et al., "Introduction to Cmos VLSI Design Lecture 8:Combination Circuits," http://pages.hmc.edu/harris/class/e158/04/index. html, Harvey Mudd College, Uploaded in 2004, accessed by UK Intellectual Property Office on Dec. 23, 2019.

* cited by examiner

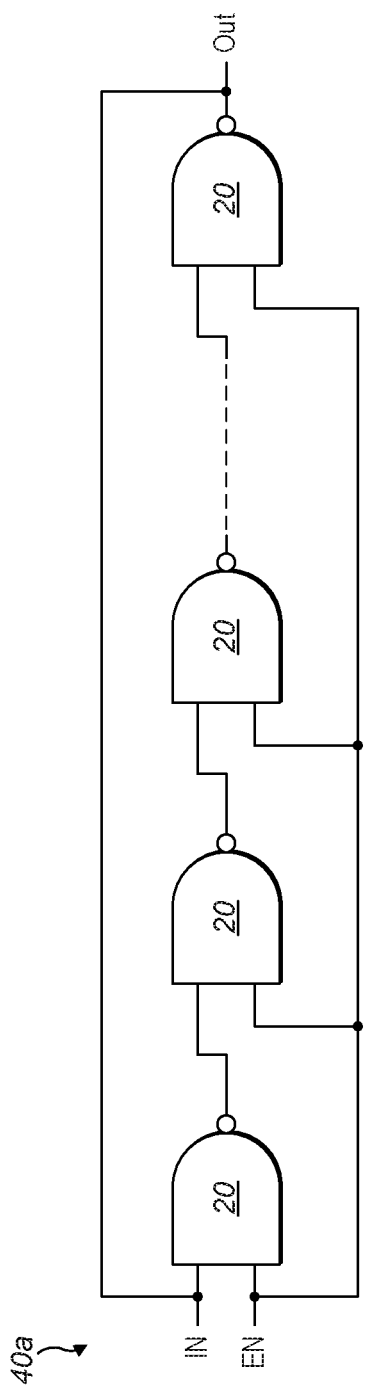
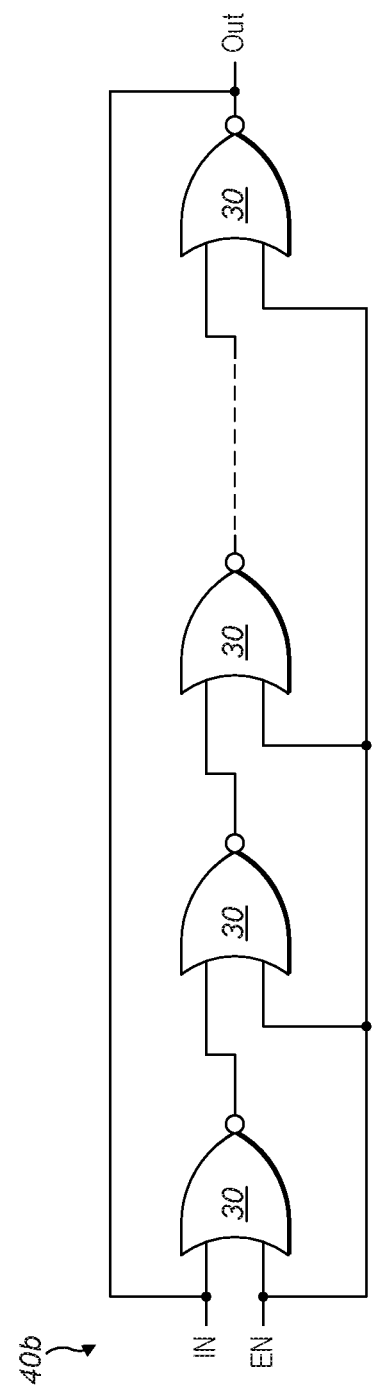
FIG. 4a
FIG. 4b

US 11,307,244 B2

ADAPTIVE VOLTAGE SCALING METHODS AND SYSTEMS THEREFOR

CROSS REFERENCE TO RELATED APPLICATIONS

This application is a National Stage of International Patent Application Serial No. PCT/GB2018/052771 (filed on Sep. 28, 2018), which claims priority to foreign patent application serial no. GB 1716083.9 (filed on Oct. 2, 2017), the contents of which are incorporated herein by reference in their entireties.

BACKGROUND

The present techniques generally relate to addressing variation in integrated circuits (IC) and particularly, but not exclusively, to using adaptive voltage scaling methods and systems.

Improvements in IC design and fabrication techniques have resulted in powerful, compact and energy efficient computing devices, such as communication devices, tablets and smartwatches becoming available to consumers.

However, process variation (e.g. differences in doping densities, oxide thicknesses, diffusion depths etc.) and operation variation (e.g. temperature) are issues in IC design, in that such process and/or operation variation may result in transistors on the same IC (e.g. at different areas) or transistors on different ICs having different characteristics from one another. Such variation will affect the performance of ICs.

Adaptive voltage scaling (AVS) techniques are used to address variation and improve power consumption on such computing devices by monitoring switching delay and adjusting the supply voltages to meet the timing requirement of the design. Known AVS monitors include in-situ monitors which monitor delays on a critical path. Other known AVS monitors include ring oscillators built using a critical path replicate, which replicate a critical data path to simulate delays therein.

However, such known AVS monitoring techniques are either required to be tuned to a particular design, and are therefore not design independent.

Design-independent delay monitors are typically based on ring oscillators built from logic standard cells, but these cannot be relied upon to represent a specific design and typically require tuning post Silicon fabrication.

BRIEF DESCRIPTION OF THE DRAWINGS

The present techniques are diagrammatically illustrated, by way of example, in the accompanying drawings.

FIG. 4a is an illustrative example of a ring oscillator having a chain of asymmetric NAND monitor cells according to an embodiment.

FIG. 4b is an illustrative example of a ring oscillator having a chain of asymmetric NOR monitor cells according to an embodiment.

DETAILED DESCRIPTION

The present techniques seek to provide improvements over known AVS techniques.

According to a first technique there is provided a logic gate for an adaptive voltage scaling monitor as claimed in claim 1.

According to a further technique there is provided a delay monitor for adaptive voltage scaling as claimed in claim 8.

According to a further technique there is provided an integrated circuit as claimed in claim 13.

According to a further technique there is provided a method of adaptive voltage scaling for an integrated circuit as claimed in claim 16.

According to an even further technique there is provided a logic gate for an adaptive voltage scaling monitor, the logic gate comprising: a first NMOS component having one or more fingers; a first PMOS component having one or more fingers; a first input coupled to the one or more fingers of the first NMOS component and the one or more fingers of the first PMOS component; a second NMOS component and second PMOS component; a second input coupled to the second NMOS component and second PMOS component; an inverting output and further comprising an imbalance between the drive strength of the first NMOS component and the first PMOS component thereof, and wherein the imbalance relates to the number of fingers of the first NMOS component and the first PMOS component and is operable to cause a switching delay of the logic gate to be primarily dependent on one of the first NMOS component or the first PMOS component.

The present techniques are applicable for IC design, and particularly, but not exclusively, for low voltage and near threshold operation, which is characterised by operating transistors, or transistor gates, at or near the threshold voltage for a transistor, whereby, reducing the supply voltage results in a corresponding reduction in the switching power (P) required to switch the transistor in accordance with $P=CfV^2$, which may be beneficial for low power devices.

However, the negative impacts of process and temperature variations on transistor performance increase as the supply voltage is reduced towards the transistor threshold voltage, whereby such variations dominate timing variation during operation.

Figure 1:
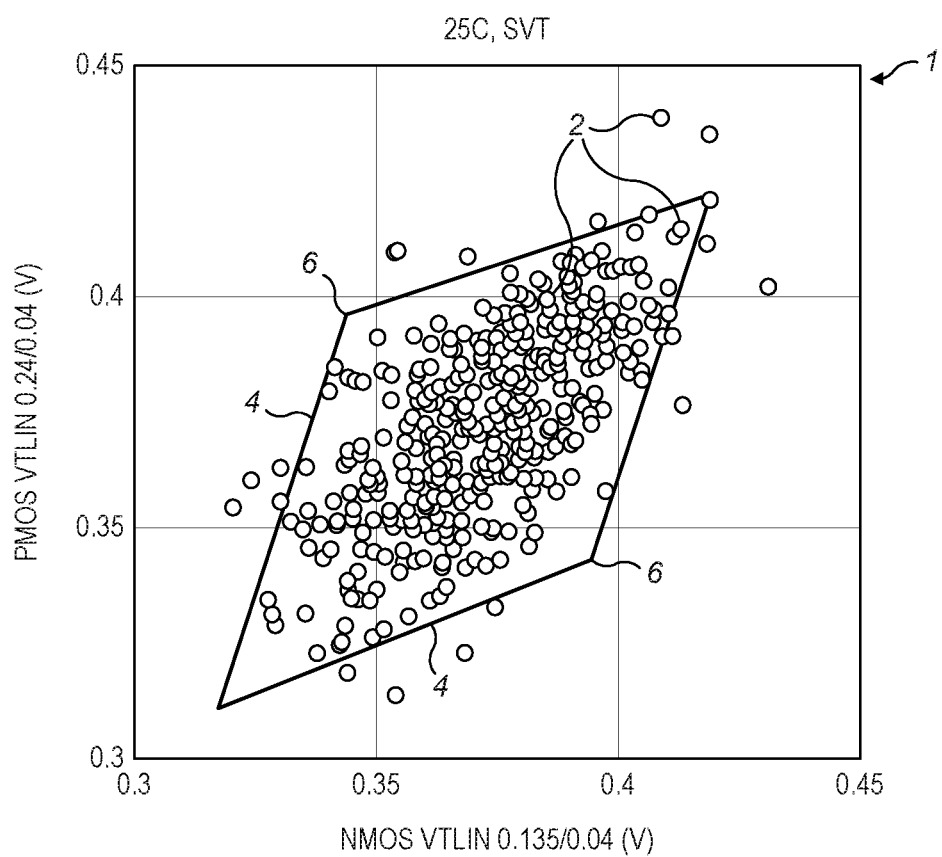
FIG. 1 is a graph which shows results of corner and process Monte-Carlo simulation for a standard voltage threshold (SVT) device type in a 40 nm CMOS process.

Designers characterise the design space of an IC during the design implementation process to take account of, and attempt to compensate for such variation, whereby the design space defined by process variation of transistor performance at a given temperature is commonly described by plotting NMOS vs PMOS voltage thresholds (VT) or drive currents. As an example, graph 1 of FIG. 1 shows results of a simulation for a standard voltage threshold (SVT) device type in a 40 nm CMOS process at 25° C., whereby the points 2 each represent Monte Carlo runs with global variation enabled plotting NMOS VT vs PMOS VT, and whereby the lines 4 connect the global corners 6: SS (Slow NMOS-Slow PMOS), FF (Fast NMOS-Fast PMOS), SF (Slow NMOS-Fast PMOS), FS (Fast NMOS-Slow PMOS).

It will be seen from FIG. 1 that there is a correlation between the NMOS and PMOS components in between FF and SS corners, which is due to variations resulting from shared factors that determine the performance of the NMOS and PMOS (e.g. both NMOS and PMOS may share the same materials e.g. a gate oxide), and the purpose of AVS techniques (e.g. as described above) is to adjust transistor switching delay by varying electrical potentials (supply voltage or back-gate potential) in accordance with the performance target of the IC.

In an IC, ring oscillators formed from standard logic cells (hereafter "standard cells") may be used to monitor the performance of PMOS and NMOS components.

Figure 2B:
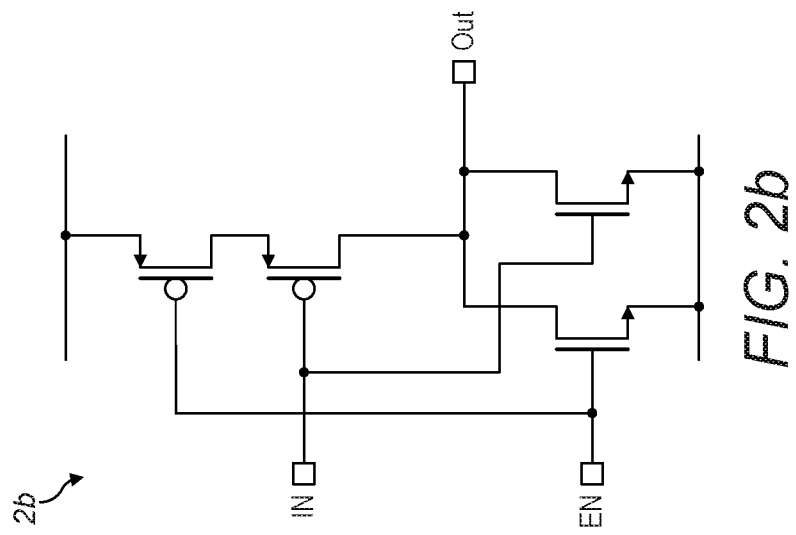
FIG. 2b is an illustrative example of a NOR standard cell.
Figure 2A:
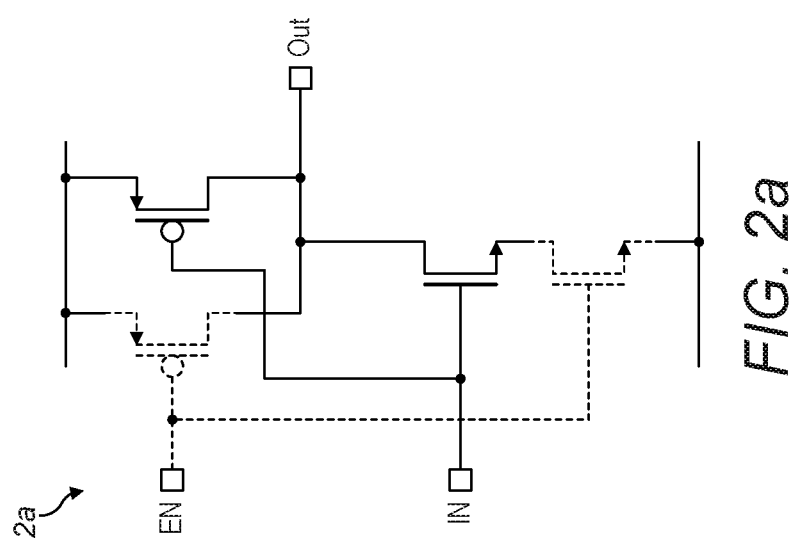
FIG. 2a is an illustrative example of a NAND standard cell.

As illustrative examples of such standard cells, FIG. 2a depicts a NAND standard cell 1a, and FIG. 2b depicts a NOR standard cell 1b, each having a first Input (IN), a second input (EN) and an output (OUT). In operation, the first input (IN) is used to propagate a signal to the output (OUT), whilst the second input is controlled externally on at least one cell within the ring to enable the oscillation.

In the standard cells of FIGS. 2a and 2b, the switching delays for the pull-up (PU) and pull-down (PD) transitions are substantially balanced or symmetric, so as not to rely more on one transistor type (e.g. NMOS) than the other (e.g. PMOS). A ring oscillator has an identical number of pull-up and pull-down events. Therefore, the result of the ring oscillator built from standard cells is not sufficient to describe the design space based on NMOS and PMOS performances as there is no information allowing to separate typical performance from FS or SF characteristics. When such standard cells are used for AVS monitors, they merely provide an indication of the general behaviour on scale from FF or SS corner.

Therefore, whilst the ring oscillator having such standard cells can detect variations resulting from shared factors, in practice, some variations result from non-shared factors (e.g. implants in an NMOS being at one end of their specification spread), which results in one type of transistor (e.g. NMOS) being positioned towards one of the SF/FS corners without influencing the position of another type of transistor (e.g. PMOS). Therefore, the non-shared factors may widen the spread in the SF and FS direction.

Due to the switching delays for the pull-up (PU) and pull-down (PD) being substantially balanced or symmetric it is not possible to identify process skews in the SF or FS directions using standard cells.

Moreover, while the pull-up and pull-down transitions in a ring oscillator are always balanced, the switching activity on a logic path can vary and be data-driven. (e.g. where a set of data results in a majority of pull-down transitions on a data path where the NMOS transistors dominate, whilst another set of data may result in a majority of pull-up transitions, where the PMOS dominate). As such, designers incorporate some pessimism into the design to take account of such variations. As the purpose of AVS is to tighten the delay performance between FF and SS, this makes the variation in the transistor design space between FS to SF more critical. It is therefore not sufficient to enable an AVS methodology that is correct by construction, based on monitors using standard cells in a ring oscillator.

According to the present techniques, there is provided an AVS delay monitor(s) which can detect and compensate for the impact of variations resulting in process skews in the FS or SF directions.

The AVS delay monitor comprises at least one CMOS logic gate (hereafter asymmetric monitor cell) comprising an output (e.g. an inverting output) and further comprising an imbalance between the drive strength of the NMOS and PMOS components thereof, such that the switching delay of the asymmetric monitor cell becomes primarily dependent on one of the NMOS and PMOS components (e.g. the weaker of the respective NMOS or PMOS components), and, therefore, can be detected.

As will be appreciated by a person skilled in the art taking account of the present specification, switching delay is a primary indicator of performance in a digital circuit, and hence detecting this metric directly, and for the type of transition arc that is prevalent in logic circuits, provides better correlation than using more indirect methods of detecting the skew, such as those of the prior art.

In use, asymmetric monitor cells allow for the extraction of the process skew of an IC in the FS or SF directions. Furthermore, in a real design such asymmetric monitor cells may be used to replicate an uneven number of PU vs PD transitions in a data path so that the design can be applied to any data path. Furthermore, the AVS monitor(s) provide a worst-case information allowing design implementation to be correct by construction, independent of the critical path or the data.

Using such information allows the sign-off to be correct by construction such that adjustments to the implementation or control algorithm in silicon may be minimised or avoided.

Figure 3A:
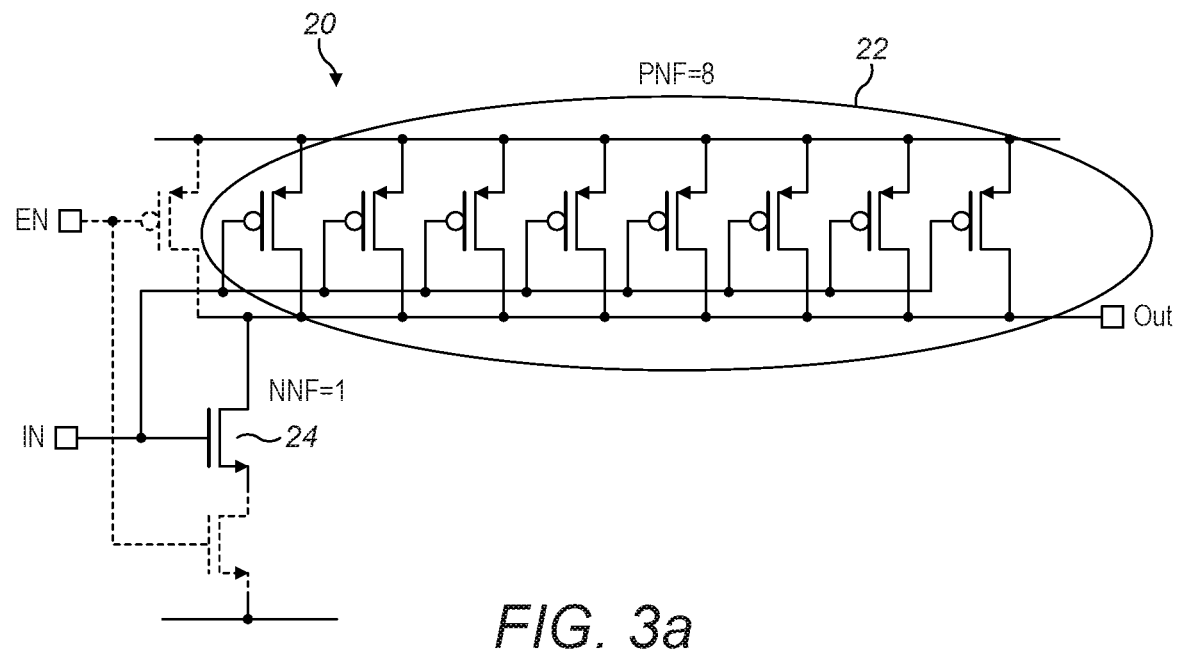
FIG. 3a is an illustrative example of an asymmetric monitor cell according to an embodiment.
Figure 3B:
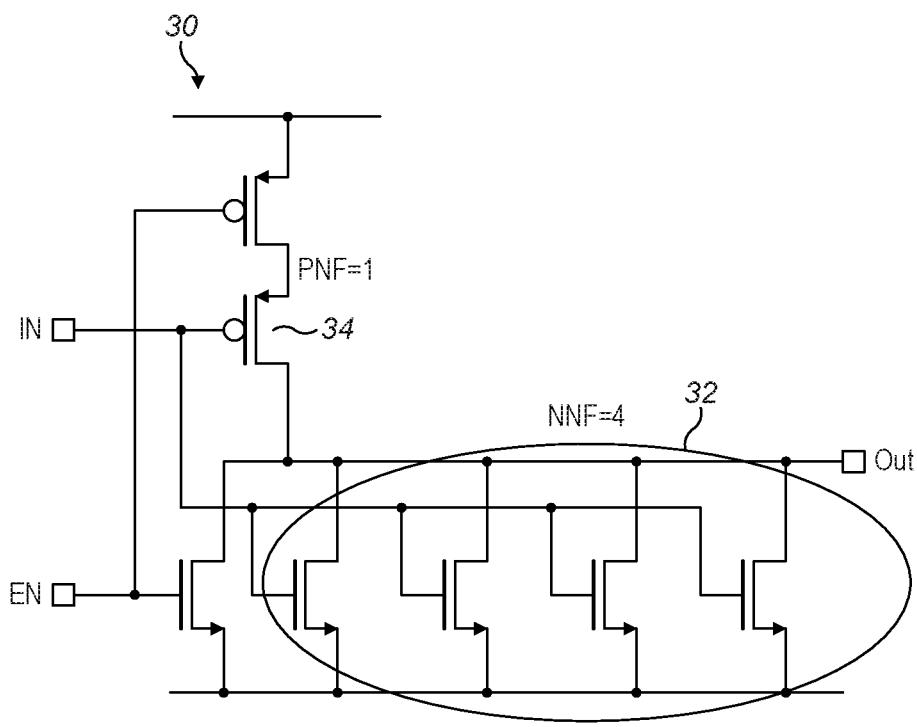
FIG. 3b is an illustrative example of an asymmetric monitor cell according to a further embodiment.

FIGS. 3a and 3b are illustrative examples of asymmetric monitor cells.

FIG. 3a schematically shows an illustrative example of an asymmetric NAND monitor cell 20 having a pull-up PMOS component 22 and a pull-down NMOS component 24, the gates of which are connected to a first input (IN), whereby the number of PMOS fingers (PNF) of the PMOS component 22 connected to input (IN) is PNF=8, whilst the number of NMOS fingers (NNF) of the NMOS component 24 connected to input (IN) is NNF=1. The NAND monitor cell also comprises NMOS and PMOS components connected to a second input (EN), whereby the second input is controlled externally to enable the monitor cell.

For the purposes of the present specification, increasing or decreasing the number of PMOS and/or NMOS fingers may comprise increasing or decreasing the number of parallel transistor gates for the respective component.

It will be appreciated that increasing the (PNF) results in an increased drive strength for the PMOS component 22 connected to the input (IN) and, as such, results in an increased pull-up speed, whereas the NMOS component (NNF=1) 24 is required to pull-down an increased load, due to increased capacitance associated with the eight PMOS fingers.

Therefore, the PD transitions in such an asymmetric monitor cell 20 will take longer in comparison to PD transitions in standard cells.

As such modifying the PNF or NNF of PMOS/NMOS components of a monitor cell may provide an imbalance between the drive strength of the NMOS and PMOS components so as to cause the switching delay of the logic monitor cell to be primarily dependent on one of the NMOS component or the PMOS component thereof.

As a further illustrative example, FIG. 3b schematically shows an asymmetric NOR monitor cell 30, having a pull-down NMOS components 32 and a pull-up PMOS component 34, the gates of which are each connected to a first input (IN), whereby the number of NMOS fingers (NNF) of the NMOS component 32 connected to input (IN) is NNF=4, whilst the number of PMOS fingers (PNF) of the PMOS component 34 connected to input (IN) is PNF=1. The NOR monitor cell also comprises NMOS and PMOS components connected to a second input (EN), whereby the second input is controlled externally to enable the monitor cell.

It will be appreciated that increasing the (NNF) results in an increased drive strength for the NMOS component 32, and, as such, results in an increased pull-down transition speed, whereas the PMOS component 34 (PNF=1) is required to pull-up an increased load, due to increased capacitance of the four NMOS fingers.

Therefore, the PU transitions in such an asymmetric monitor cell 30 will take longer in comparison to PU transitions in standard cells.

In embodiments, a delay monitor having first and second sets of asymmetric monitor cells is used to monitor the PU and PD transitions, whereby a delay monitor may be provided per VT device type (e.g. SVT, low VT, extra high VT) on an IC, or a delay monitor may be provided per logic library on an IC, whereby each logic library may be defined by channel length.

As an illustrative example, a first set of asymmetric monitor cells (e.g. comprising asymmetric NAND monitor cells) may be configured as a first ring oscillator arranged to monitor PD transitions, whilst a second set of asymmetric monitor cells (e.g. comprising asymmetric NOR monitor cells) may be configured as a ring oscillator arranged to monitor PU transitions.

It will be appreciated by a person skilled in the art taking account of the present specification that the delay monitors are not limited to using ring oscillators to measure the PU/PD transition and may use any configuration of asymmetric monitor cells or sets thereof. As an illustrative example, the delay monitors may comprise one or more sets of asymmetric monitor cells, each set configured as a delay line (e.g. a linear delay line) arranged to monitor PU or PD transition times.

In an illustrative example, FIG. 4a schematically shows an example of a ring oscillator 40a having 'n' asymmetric NAND monitor cell 20 stages (as depicted in FIG. 3a above), whilst FIG. 4b schematically shows an example of a ring oscillator 40b having 'm' asymmetric NOR monitor cell 30 stages (as depicted in FIG. 3b above) (where 'n' and 'm' are integers, and whereby, in examples, 'n' and 'm' are odd)

It will be appreciated by a person skilled in that art, the 'n' or 'm' asymmetric monitor cell stages may be chosen so as to average, and thus minimise, the effects of random variation. For example, a ring oscillator with m=n=31 has been found to be suitable to minimise the effects of random variation in a 40 nm CMOS process, although the claims are not limited in this respect, and any number of n or m stages may be provided.

Each of the NAND or NOR monitor cells 20, 30 in the chain receives an enable signal (EN), whilst the first monitor cell in the chain is connected to the input line (IN) and the output (OUT) from the last monitor cell in the chain.

Although not explicitly shown, the ring oscillators may include other logic or components such as one or more inverters, buffers, counters to characterise their oscillation frequency etc. as will be appreciated by a person skilled in the art.

For example, a digital counter may count the number of PU or PD transitions during a sample period to determine whether the respective PU/PD transitions are fast or slow relative an expected transition time.

It will be appreciated that other configurations of ring oscillators other than those depicted in FIGS. 4a and 4b may be used. For example, each stage in a ring oscillator may comprise an asymmetric monitor cell with, for example, an asymmetric NAND or NOR monitor cell arranged to receive an enable signal and the output from the last stage.

By using ring oscillators comprising asymmetric monitor cells to increase the time it takes for the PU transitions or PD transitions, it becomes possible to determine the impact of variation on the NMOS transistors in the SF/FS directions.

Figures 5A, 5B:
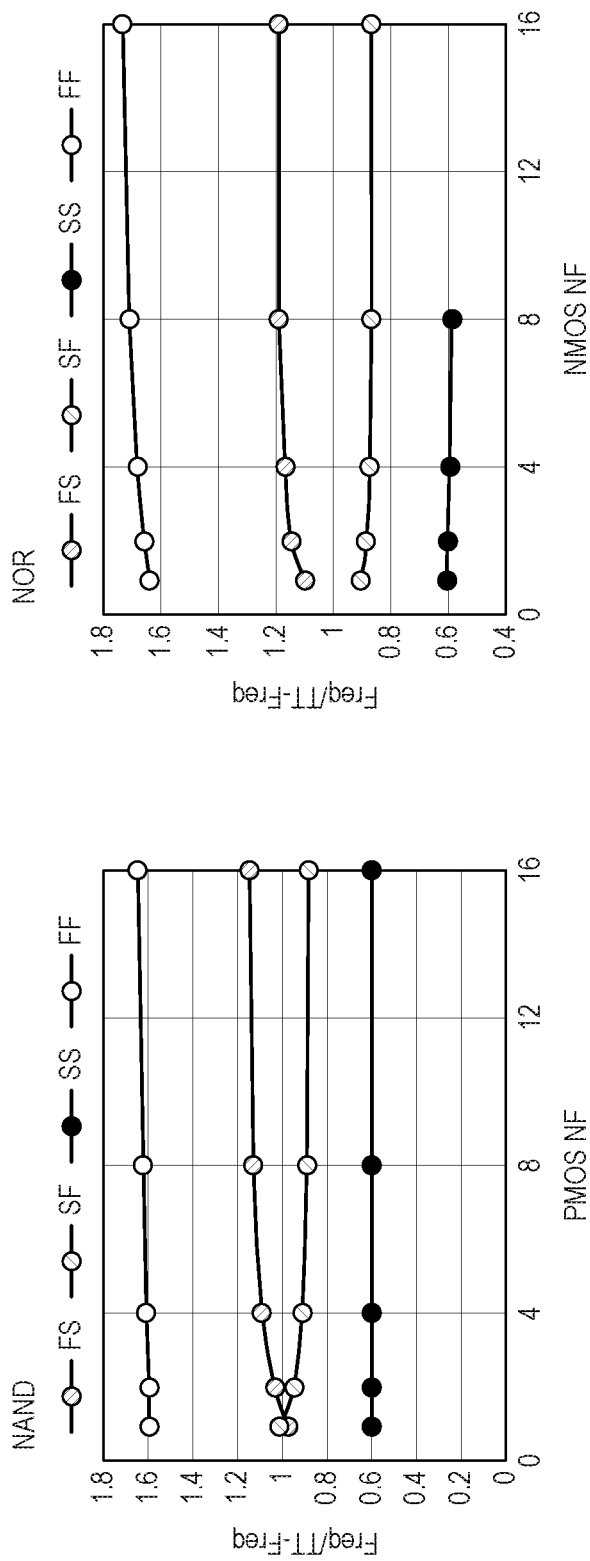
FIG. 5a is a graph which illustratively shows the dependence of the frequency on the PMOS vs NMOS strength in a NAND cell for different process corners after normalisation to the TT process corner.
FIG. 5b is a graph which illustratively shows the dependence of the frequency on the NMOS vs PMOS strength in a NOR cell for different process corners after normalisation to the TT process corner.

As an illustrative example of such functionality, FIG. 5a shows the dependence of the switching frequency (Freq) on the PMOS vs NMOS strength in a NAND cell for different process corners after normalisation to the switching frequency for the typical-typical process corner (TT-Freq), and plots Freq/TT-Freq against PNF for the different process corners shown.

With PNF=1, representative of a symmetric standard cell, whilst there is a discernible difference between the values detected at the SS and FF process corners, the values at the SF and FS process corners are substantially similar, and so it is not possible to determine whether the PMOS transistors are switching faster/slower relative the NMOS transistors at those corners.

However, as described above, increasing PNF results in an increased drive strength for the PMOS connected to the input (IN) and results in a reduced pull-down transition speed, such that it becomes possible to determine the switching frequency of the NMOS component at the SF and FS process corners, and therefore, the switching speeds of the NMOS components at those corners.

As a further illustrative example of such functionality, FIG. 5b shows the dependence of the switching frequency (Freq) on the PMOS vs NMOS strength in a NOR cell for different process corners after normalisation to TT-Freq, and plots Freq/TT-Freq against NNF for the different process corners shown.

With NNF=1, representative of a symmetric standard cell, whilst there is a discernible difference between values at the SS and FF process corners as the frequency changes from fast to slow, the difference between the values at the SF and FS process corners is much reduced in comparison.

However, as described above, increasing NNF results in an increased drive strength for the NMOS connected to the input (IN) and results in a reduced pull-up transition speed for the PMOS component, such that it becomes possible to determine the frequency of the PMOS at the SF and FS process corners, and therefore, the switching speeds of the PMOS components at those corners.

With the above in mind it is possible to identify process skews in the SF or FS directions using the asymmetric monitor cells.

As will be understood, increasing the number of fingers in a cell will increase the size of the cell which may be undesired. Therefore, the appropriate number of fingers used in any particular asymmetric monitor cell may be determined by size constraints and/or by the desired sensitivity. For example, the difference between the SF/FS corners in FIG. 5a reaches saturation at approximately PNF=8. Therefore, the maximum PNF in that particular example may be 8. Similarly, the difference between the SF/FS corners in FIG. 5b reaches saturation at approximately NNF=4. Therefore, the maximum NNF in that particular example may be 4.

It will be understood that using an AVS delay monitor with asymmetric monitor cells it is possible to discern when an NMOS is slow SF or fast FF, and it is possible to discern when a PMOS is slow SF or fast FF, and therefore, to detect process skews resulting from variation.

Figure 6:
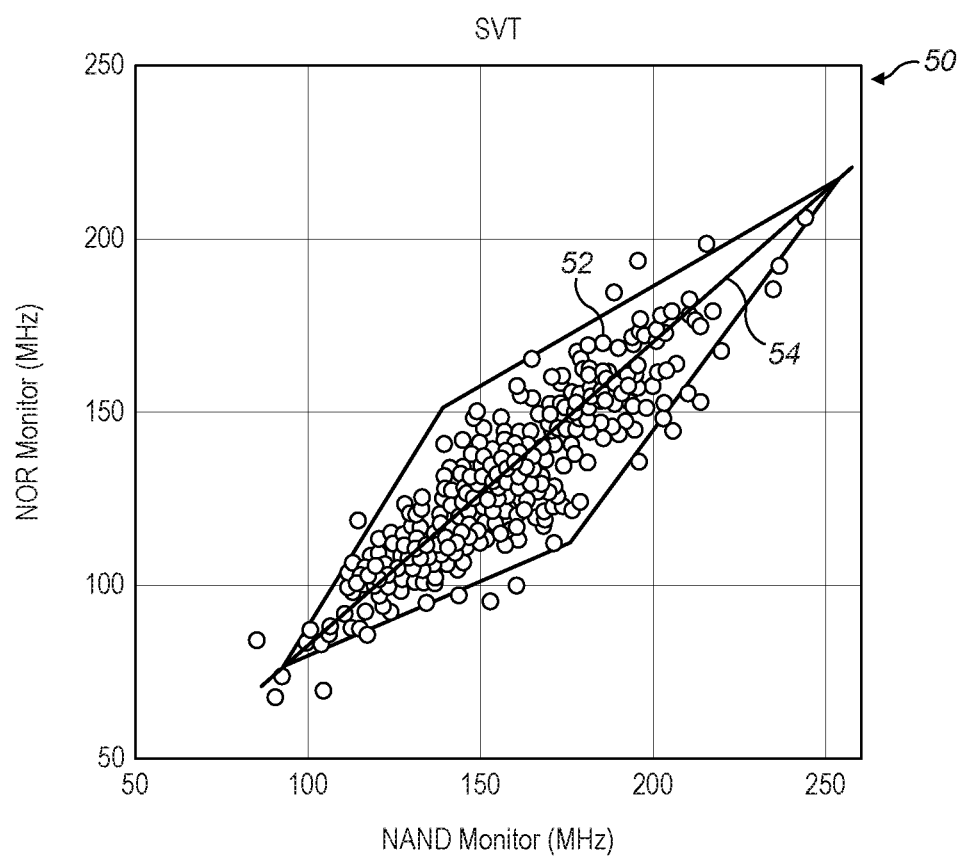
FIG. 6 is a graph which illustratively shows results of a frequency simulation for a set of monitors at VDD=0.7V, T=25V for a standard voltage threshold (SVT) device type.

FIG. 6 depicts results of a simulation 50 for an SVT device type, whereby the points 52 each represent Monte Carlo runs with global variation enabled for VDD=0.7V at 25° C. In FIG. 6, the results are plotted in terms of asymmetric monitor cell performance rather than in terms of VT as depicted in FIG. 1, whereby the NMOS and PMOS VT are substituted with the NAND and NOR monitor frequencies. Whereas ring oscillators based on standard cells only describe the delay variation as along a line 54 connecting the SS and FF corners, the use of asymmetric monitor cells captures the transistor design space.

Figure 7A:
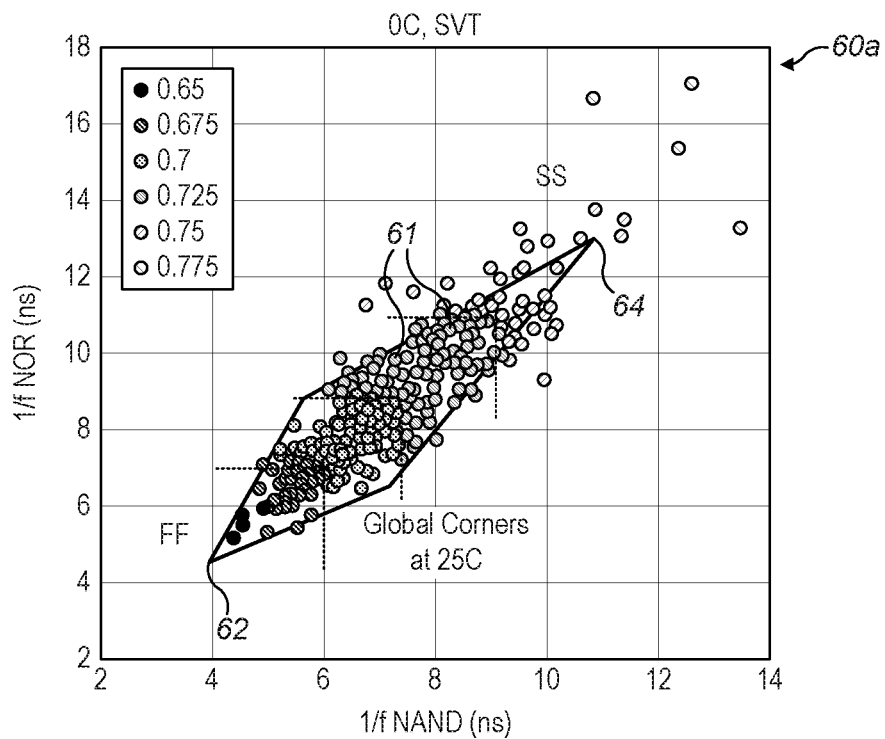
FIGS. 7a-7c are graphs which illustratively show ring delay (1/f) at VDD=0.7V for various temperature and colour coded for the AVS VDD set-point.
Figure 7B:
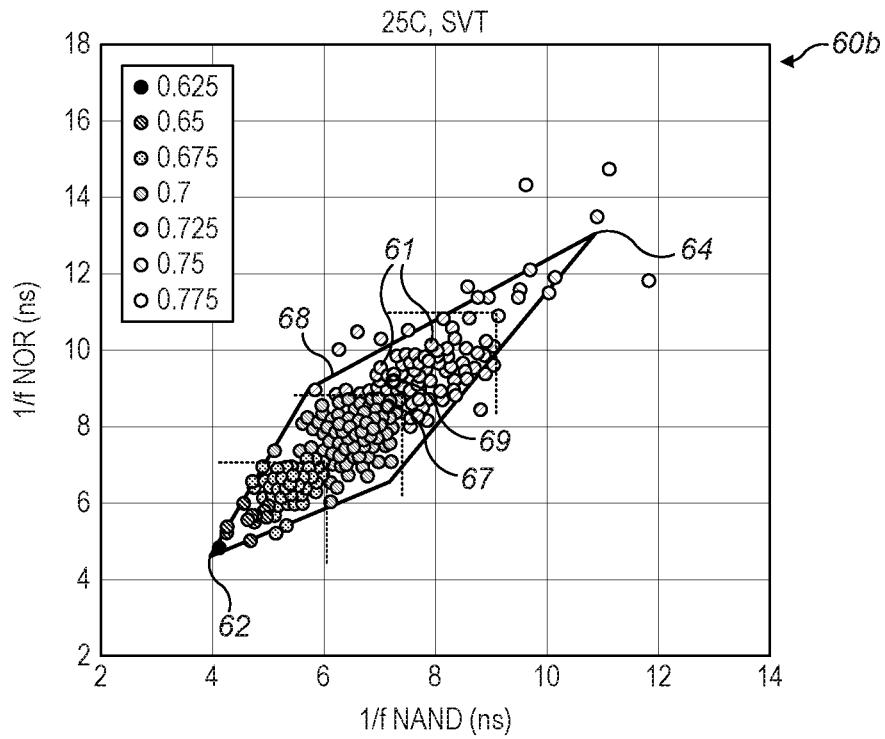
Figure 7C:
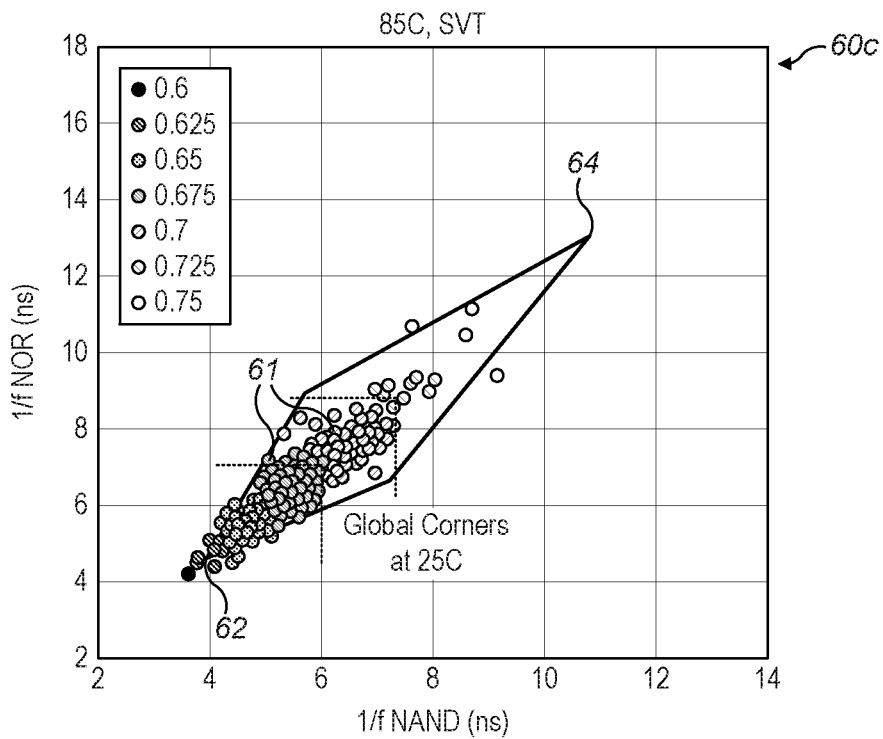

The graphs 60a-60c of FIGS. 7a-7c plot the delay (1/f) at VDD=0.7V for the NAND and NOR asymmetric monitor cells and the resulting points 61 at 0° C., 25° C. and 85° C., whereby in the illustrative examples the points 61 are colour coded with the supply voltage that is required to maintain a target speed performance. Furthermore, the Global Corners are at 25° C. for reference, whilst the supply voltage is regulated in 25 mV steps, although the claims are not limited in this respect and the supply voltage may be regulated in larger or smaller steps.

As depicted in FIGS. 7a-7c, all the points towards the global corners 62 have reduced switching delays and, therefore, require a reduced supply voltage in comparison to the points towards the global corners 64.

As is evident from FIGS. 7a-7c, it will be appreciated that using the asymmetric monitor cells it is possible to detect when a PMOS switching delay is greater than a NMOS switching delay (or vice versa), and, therefore, it is possible to adjust the supply voltage to achieve a particular performance for the respective NMOS or PMOS components.

Taking the 0.7V boundary line 68 as an illustrative example, a point 67 at a first side of the of the boundary line 68 is representative of PMOS having lower switching delays in comparison to a point 69 at a second side of the boundary line 68, while the NMOS has comparable delay. Therefore, as it is now possible to detect that the PMOS represented by point 69 is slow, the supply voltage can be regulated to provide the appropriate voltage for point 69.

As such, using the present AVS techniques, it is possible to adjust the supply voltage in response to the switching delays of the CMOS components used in the design to achieve a desired operation correct by construction in response to the identified process skews.

As will also be appreciated, temperature variation may affect the operation of ICs, whereby switching delays increase as the temperature decreases whereby the graph FIG. 7a depicts the impact of 0° C. on switching delays, FIG. 7b depicts the impact of 25° C. on switching delays, and FIG. 7c depicts the impact of 85° C. on switching delays.

As switching delays are measured using the present techniques, the effect of temperature variation can be detected and the supply voltage adjusted in response.

With the above in mind, the present AVS techniques provide a way to identify NMOS and PMOS switching delays, and to compensate for such delays so as to maintain the device performance away from the SS global corner. For example, the VDD may be modified to ensure that that PU or PD times identified by a particular process skew or operating temperature meet the performance criteria set at the design stage.

Figure 8:
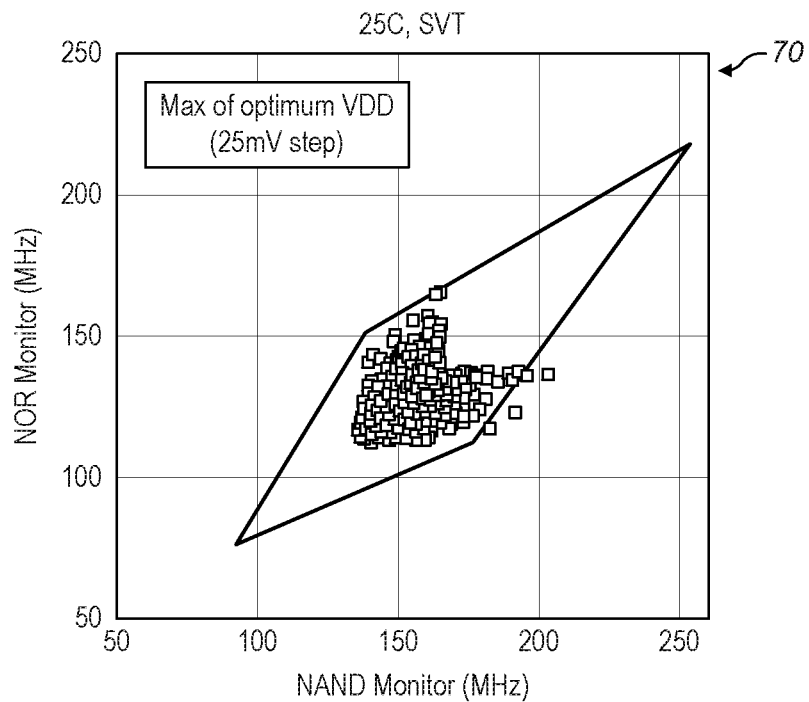
FIG. 8 is a graph which illustratively shows simulation results for asymmetric NAND and NOR monitor cells at optimum VDD.

FIG. 8 is a graph 70 which illustratively shows simulation results for asymmetric NAND and NOR monitor cells at optimum VDD, and whereby the supply voltage is adjusted to ensure that performance does not fall below the target implementation window (i.e. near TT performance).

Since the performance criteria must be met for each asymmetric NAND or NOR monitor on a common VDD the resulting points provide a tail of faster switching cells, whilst the slow tail that causes a severe degradation of the achievable performance in a low-VDD or near threshold design without such AVS is avoided.

Figure 9A:
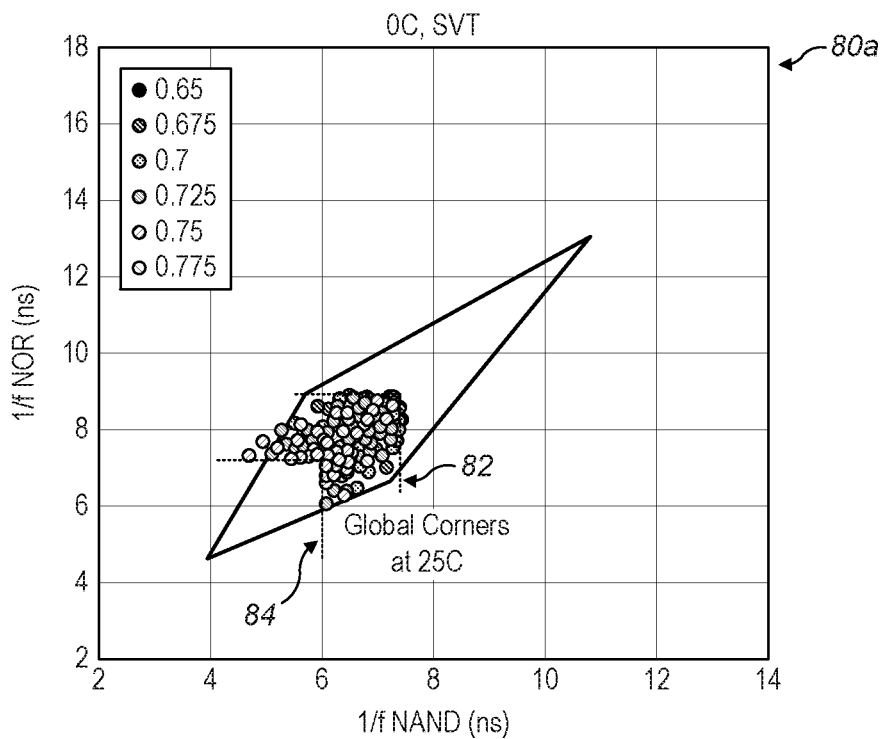
FIGS. 9a-9c are graphs which illustratively show ring delay (1/f) with each instance running the optimum AVS VDD set-point assuming 25 mV regulator step.
Figure 9B:
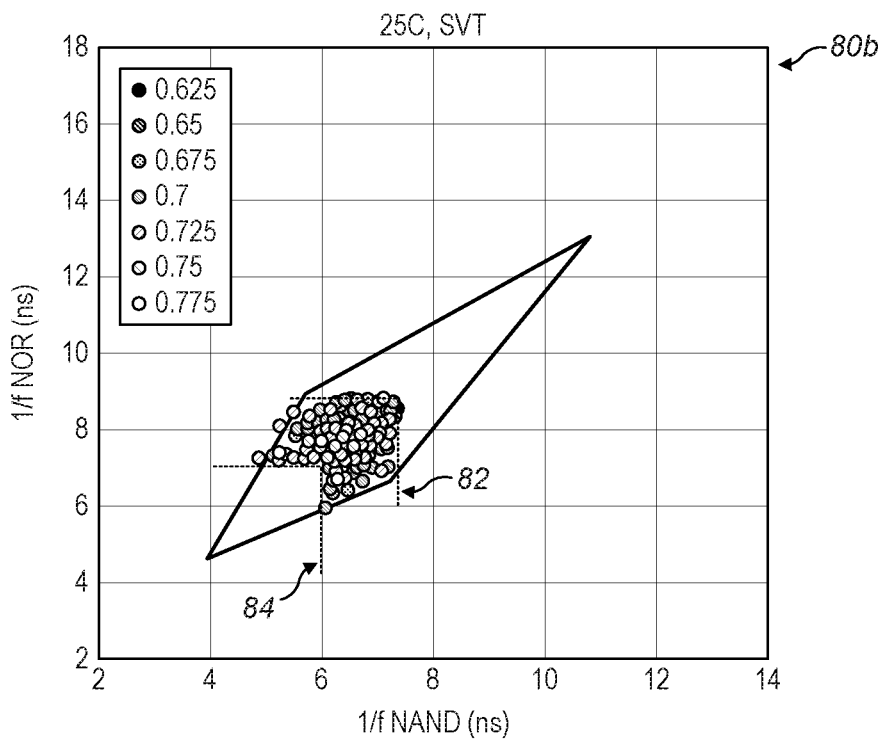
Figure 9C:
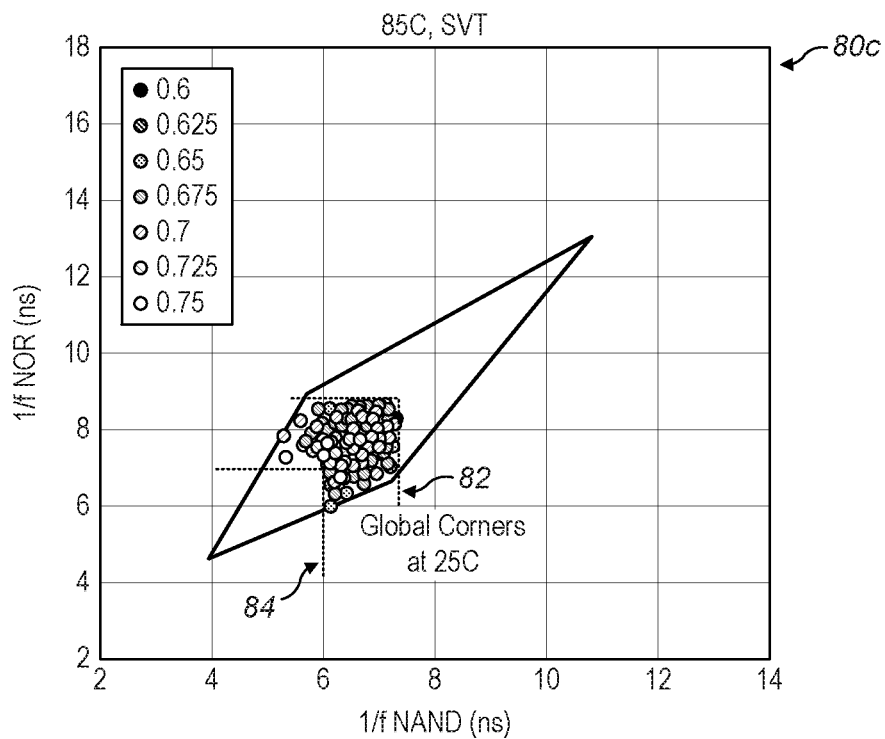

The graphs 80a-80c of FIGS. 9a-9c show ring switching delay (1/f) with each instance running the optimum AVS VDD set-point assuming 25 mV regulator step. The global corners of FIGS. 9a-9c are at set 25° C. as with FIGS. 7a-7c to provide a common reference.

By using the present AVS techniques to determine switching delays in response to temperature, and setting the VDD of each point to the optimum point on a 25 mV step scale it is possible to compensate for the impact of temperature on switching delay, thereby providing desired performance through a range of temperatures.

Therefore, the present AVS techniques, which monitor switching delays and compensate for the effect of process and temperature variation thereon, mean that it is possible to improve both the design and the performance of ICs in particular at low threshold and near near-threshold operation, in comparison to AVS techniques which adjust supply voltage in response to monitoring VT.

Figure 10A:
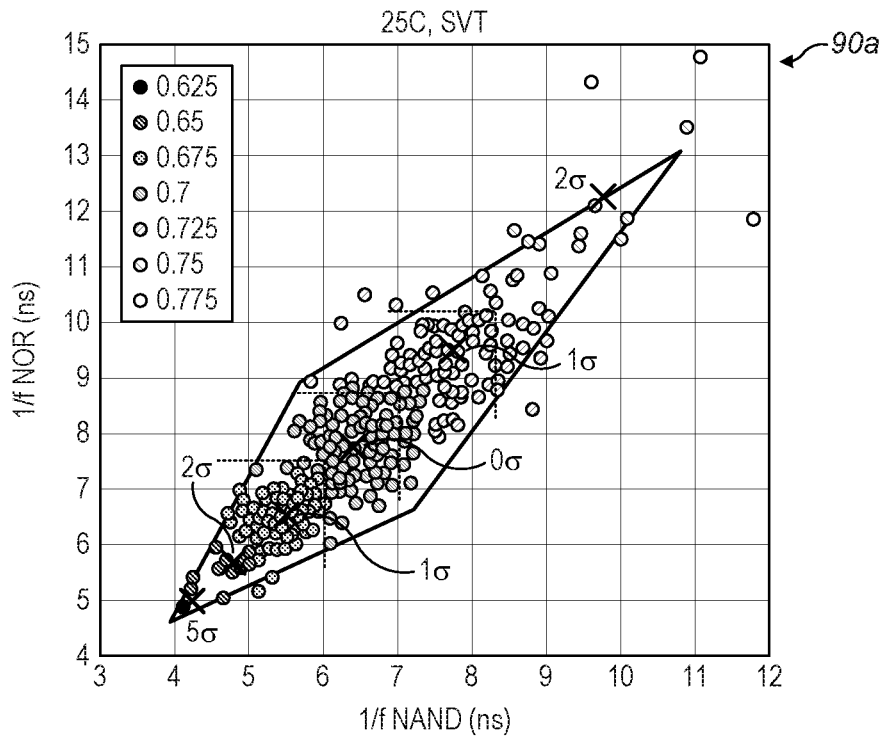
FIGS. 10a and 10b are graphs showing simulated instances with VDD set-point assigned by switching delay and comparison to VT.
Figure 10B:
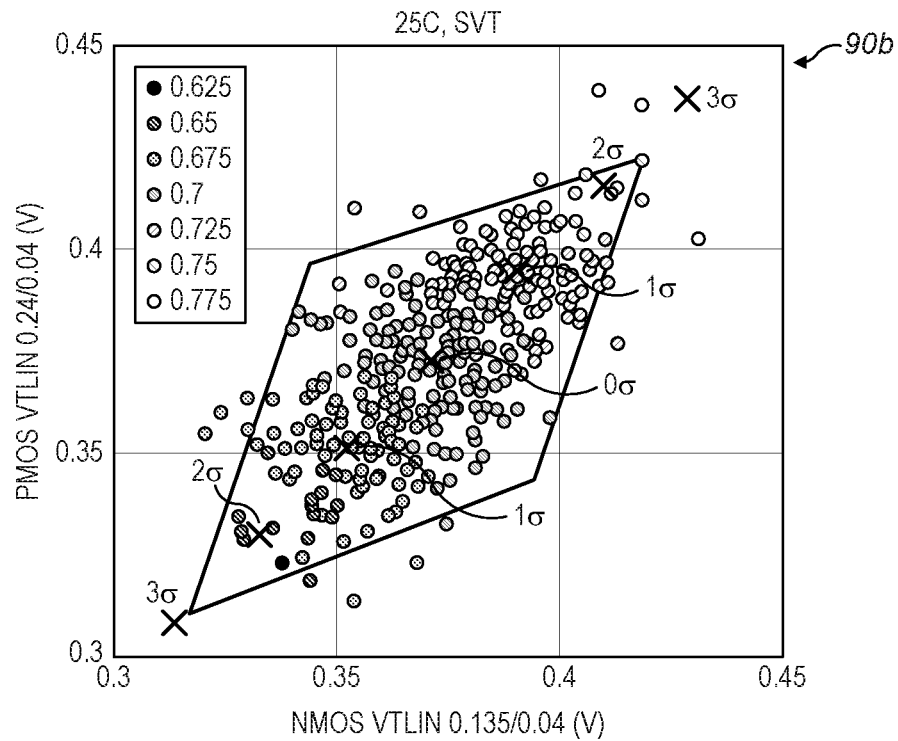

As an illustrative example of such a comparison, graphs 90a and 90b of FIGS. 10a and 10b show simulated instances with VDD set-point assigned by switching delay and VT respectively.

It is evident that detecting process skew using VT results in a wider spread in the FS and SF directions and leads to a significant mixing of population demonstrating reduced performance in comparison to detecting process skews using switching delays (e.g. for Pull-up/Pull down transitions). As described above, switching delay is a primary indicator of performance in a digital circuit, and detecting this metric directly means that monitoring performance and subsequent compensation can be improved in comparison to using monitors having standard cells that cannot directly detect switching delays.

AVS operations may be performed during the operation of an IC so as to adjust the supply voltage to compensate for the effects of variation (e.g. process/temperature) during runtime, and to ensure that the device performance is maintained within specified boundaries.

As an illustrative example, ring oscillators comprising asymmetric monitor cells may be provided as physical IP or synthesizable RTL implementation on an IC. It will be appreciated that such physical IP is not dependent on the design of the critical data path within the design, and so does not require to be tuned to a particular IC or data path.

Figure 11:
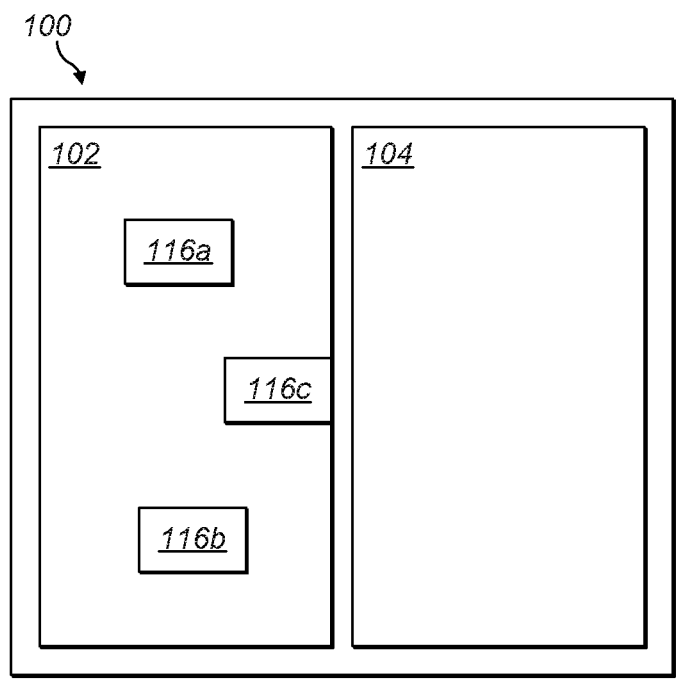
FIG. 11 is an illustrative example of a system on chip (SoC) floorplan according to an embodiment.

FIG. 11 is an illustrative example of an IC or system on chip (SoC) floorplan 100 having a digital core 102 and an analog circuit area 104.

As variation may occur across the digital core 102 and impact the performance thereof, the digital core 102 is provided with physical sensing network IP comprising one or more AVS delay monitors 116 (ADM) which are used to monitor performance of devices thereon, and to compensate for such variation by adjusting the supply voltage accordingly. Such ADMs comprise asymmetric monitor cells to monitor the performance of the IC and compensate for any variation detected.

For an SoC, ADMs 116a and 116b may be provided in the digital core to represent an area thereon (e.g. to represent a radius of 1 mm although it will be appreciated that the claims are not limited in this respect).

Furthermore, one or more ADMs 116c may be provided at a boundary representing a change in device density on the SoC (e.g. depicted as the boundary 118 between the digital core 102 and analog circuit area 104.) In examples, the ADM may be provided between 0-500 µm from such a boundary, although the claims are not limited in this respect.

Figure 12:
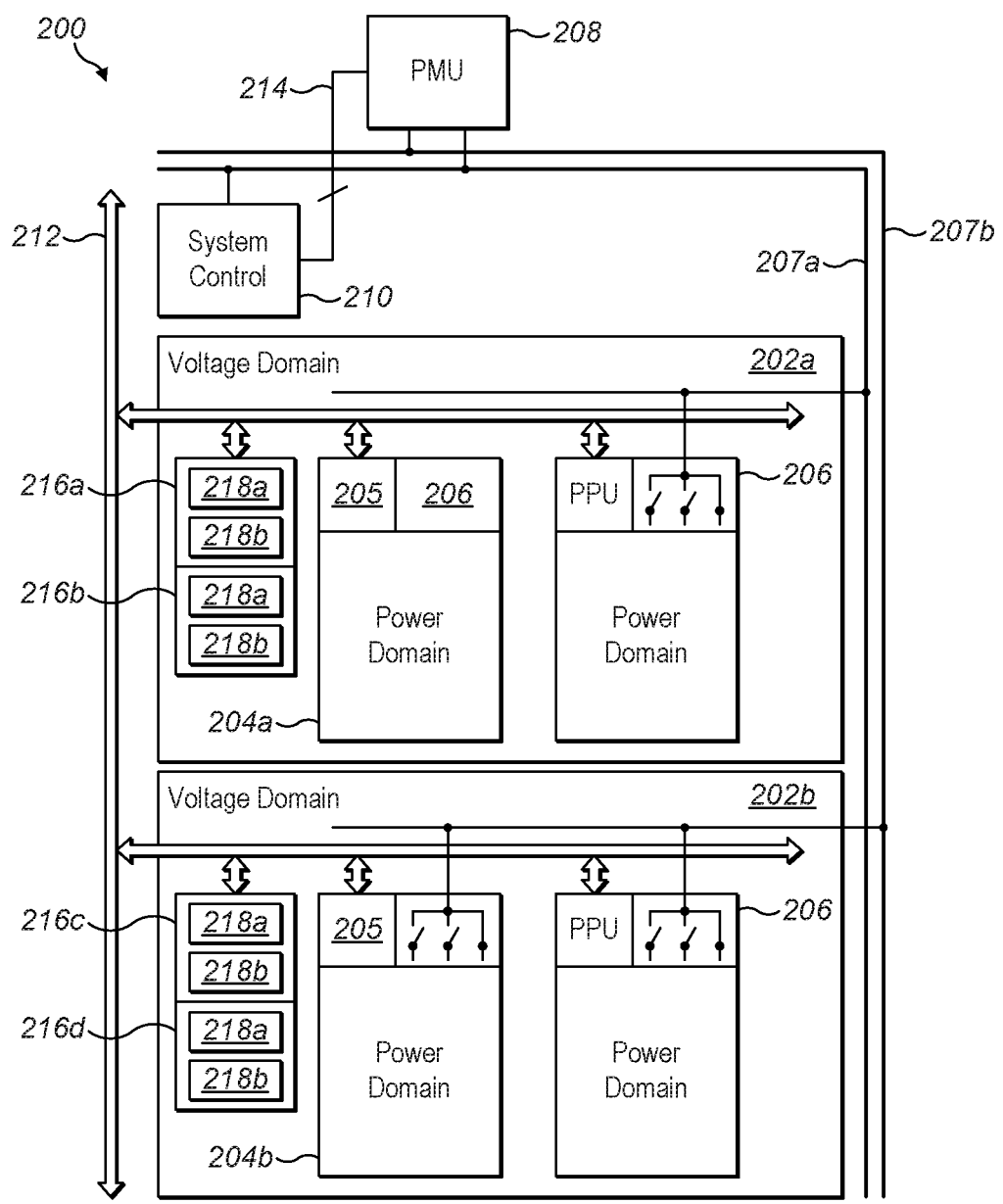
FIG. 12 is an illustrative example of a system on chip (SoC) power control system according to an embodiment.

FIG. 12 is a further illustrative example of an IC or SoC power control system 200 having physical sensing network IP comprising ADMs 216.

IC 200 comprises two voltage domains 202a, 202b, although the claims are not limited in this respect and any number of voltage domains may be provided in the IC. Each voltage domain receives a respective voltage supply (e.g. 0.8, 1V, etc.).

The voltage domains depicted in FIG. 12 each comprise two power domains 204, whereby the power domains 204 each have an associated power policy unit 205 (PPU), and power control switches 206.

The PPU 205 controls, e.g. using power control switches 206, the power state of the power domain 204. For example, the PPU may control the power gating, retention, and/or clock gating for a respective power domain 204. In examples, the power domain may comprise a processor core (e.g. an ARM® Cortex M-class core) although the claims are not limited in this respect.

Whilst each voltage domain 202 of FIG. 12 comprises two power domains 204, the claims are not limited in this respect and any number of voltage domains may be provided in the IC.

The voltage domains 202 are supplied by a power management unit (PMU) 208 via a respective power distribution network 207. The PMU 208 controls the voltage provided to the power domains, whereby, in examples, the PMU 208 comprises one or more voltage regulators (not shown) for supplying the respective voltages.

The voltage domains 202 are also coupled to a system control unit (SCU) 210 via a control bus 212, whereby the SCU 210 provides control of operating modes in the IC. The SCU 210 may comprise hardware and/or software control, although the claims are not limited in this respect. For example, the SCU 210 may comprise a microcontroller or a hardware state machine.

The SCU 210 is also in communication with PMU 208 via bus 214, whereby the SCU 210 determines the voltage to be supplied to the respective voltage domains 202.

The voltage domains 202 also comprise at least one AVS delay monitor (ADM) 216, which is in communication with SCU 210 via control bus 212, whereby each delay monitor 216 comprises a first set of asymmetric monitor cells 218a and a second set of asymmetric monitor cells 218b, and whereby each set may be configured as a ring oscillator, configured to monitor PU or PD transition times respectively.

In embodiments, an ADM 216 may be provided per VT device type or logic library to be monitored.

As depicted in FIG. 12, ADMs 216a and 216b, which are associated with voltage domain 202a, each comprise first and second sets of asymmetric monitor cells 218a and 218b, whereby the power domain 204a may comprise two VT device types (e.g. SVT and extra high VT device types).

Similarly, ADMs 216c and 216d, which are associated with voltage domain 202b, each comprise first and second sets of asymmetric monitor cells 218a and 218b, whereby the power domain 204b may also comprise two VT device types (e.g. SVT and low VT device types).

According to the present techniques, in operation the respective ADMs 216a-d may be used to monitor the effects of variation on the performance of the different VT device types in the power domains 204, and to feedback the results to the SCU 210, which can regulate the voltage supply from the PMU 208 to achieve a particular performance in response to the monitored characteristics. It will be appreciated that the SCU 210 may comprise information relating to ADMs to allow it to process the results received from the ADMs 216a-d and regulate the supply appropriately.

In use, each ADM 216a-d comprises first and second sets of asymmetric monitor cells which can replicate the transistor design space as defined by NMOS and PMOS performances including the impact of an uneven number of PU vs PD transitions in a data path (e.g. as may result from different data sets being processed), and so this additional degree of freedom allows the voltage supply to be regulated on the IC 200 in a manner that guarantees minimum speed performance by construction in comparison to an IC where only standard monitor cells are used.

Figure 13:
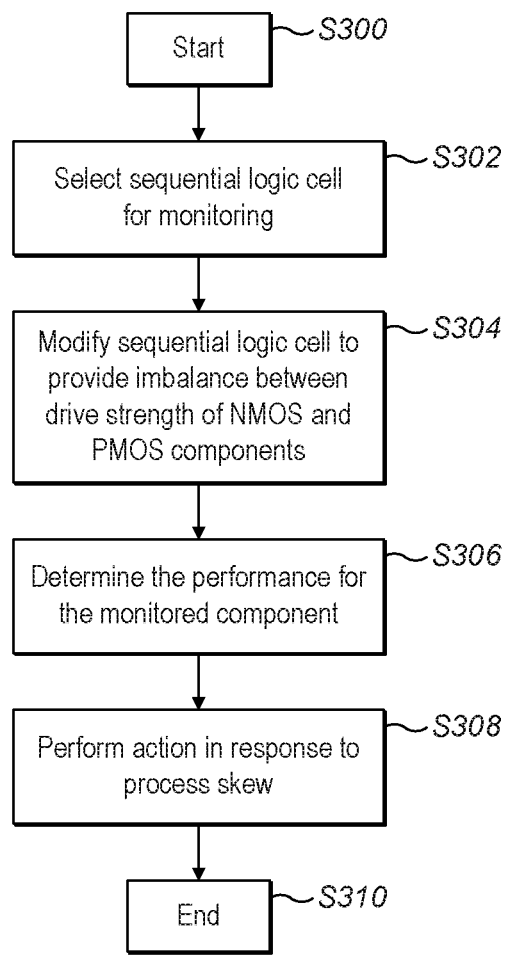
FIG. 13 is a flow diagram of steps in an example AVS operation according to an embodiment.

FIG. 13 is a flow diagram of steps to provide an asymmetric monitor cell to monitor device performance according to an embodiment.

At step S300 the method starts.

At step S302, a CMOS logic gate is selected for a component to be monitored in an IC (e.g. NMOS or PMOS). For example, a CMOS NAND gate may be selected when an NMOS component is to be monitored, whilst a CMOS NOR gate may be selected when a PMOS component is to be monitored.

At step S304, the logic gate is modified to provide an imbalance between the drive strength of the NMOS vs PMOS components such that the switching delay becomes primarily dependent on one of the NMOS or PMOS components. In an illustrative example the PNF or NNF of NMOS and PMOS components may be modified to provide an imbalance between the drive strength thereof so as to cause the switching delay of the logic monitor cell to be primarily dependent on one of the NMOS component or the PMOS component thereof.

At step S306, the modified logic gate, or asymmetric monitor cell, is used to determine the performance of the monitored component (e.g. switching delay/frequency). For example, the asymmetric monitor cell may be provided as part of a synthesised ring oscillator for simulation during design and be embedded on an IC as physical IP (e.g. sensing network IP).

At step S308, an action is taken in response to the device performance, whereby as an illustrative example, such an action may comprise adjusting supply voltage to ensure the design operates within the timing limits for which the IC was designed. The use of this method allows to keep the device within a tighter range of switching delays at the design stage and subsequently during the operation of a part in the field, thus allowing better power and performance.

At step 310 the process ends.

As described above, the present techniques are readily applicable for low-voltage, including near-threshold operation.

Furthermore, whilst the examples above describe asymmetric NAND and NOR monitor cells, the claims are not limited in this respect, and it will be appreciated that the asymmetric switching delay property is applicable to different types of logic monitor cells with, for example, inverting outputs, whereby the PNF or NNF of NMOS and PMOS components of such logic monitor cells may be modified to provide an imbalance between the drive strength of the NMOS and PMOS, to cause the switching delay of the logic monitor cell to be primarily dependent on one of the NMOS component or the PMOS component thereof.

For any candidate logic cell, the appropriate PNF or NNF may be selected as set out above with respect to FIGS. 5a and 5b, to allow for the frequency, and therefore the switching speeds, of the respective PMOS and NMOS components to be determined.

Furthermore, whilst the imbalance between the drive strength of the NMOS and PMOS in the asymmetric monitor cells is described as being provided by adjusting one or more of the PNF and NNF of transistors connected to the input line, the claims are not limited in this respect and there are other ways to provide such an imbalance.

For example, the gate dimensions (e.g. width or length) of the transistors may be varied to obtain an imbalance. However, it will be appreciated that changing the gate dimensions of transistors in a cell to provide an imbalance between the drive strengths thereof will impact other physical attributes which may make the monitor less representative of the design, which may not be desirable. As an illustrative example, increasing the gate width of an NMOS or PMOS by a factor of 4 or 8 respectively may mean that the resulting asymmetric monitor cell is too large to incorporate into the standard cell logic area, whilst decreasing the gate width of an NMOS or PMOS by a factor of 4 or 8 respectively may mean that the width of the resulting asymmetric monitor cell is below a specified minimum width. It is generally preferable to keep the physical attributes (channel length, width, pitch) consistent with the cell library used to implement the logic circuits.

Notwithstanding that, it may be beneficial to supplement modifications to the NNF/PNF by also modifying the dimensions of the transistors rather than solely relying on modifying the NNF/PNF.

As above, the present techniques are suitable for low voltage and near threshold operation, and are applicable for low compute power devices used in the internet of things (IoT) (e.g. sensor nodes). However, as will be appreciated, the present techniques are not limited for use in low compute power devices, and are also applicable for devices having higher power requirements (e.g. home computers, smartphones, tablets, servers etc.).

In some embodiments, one or more logic gates in accordance with the present techniques may be used as part of a combinatorial logic circuit. In some embodiments, one or more logic gates in accordance with the present techniques may be used as part of a sequential logic circuit.

Embodiments of the present techniques further provide a non-transitory data carrier carrying code which, when implemented on a processor, causes the processor to carry out the methods described herein.

The techniques further provide processor control code to implement the above-described methods, for example on a general-purpose computer system or on a digital signal processor (DSP). The techniques also provide a carrier carrying processor control code to, when running, implement any of the above methods, in particular on a non-transitory data carrier or on a non-transitory computer-readable medium such as a disk, microprocessor, CD- or DVD-ROM, programmed memory such as read-only memory (firmware), or on a data carrier such as an optical or electrical signal carrier. The code may be provided on a (non-transitory) carrier such as a disk, a microprocessor, CD- or DVD-ROM, programmed memory such as non-volatile memory (e.g. Flash) or read-only memory (firmware). Code (and/or data) to implement embodiments of the techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language). As the skilled person will appreciate, such code and/or data may be distributed between a plurality of coupled components in communication with one another. The techniques may comprise a controller which includes a microprocessor, working memory and program memory coupled to one or more of the components of the system.

Computer program code for carrying out operations for the above-described techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

It will also be clear to one of skill in the art that all or part of a logical method according to the preferred embodiments of the present techniques may suitably be embodied in a logic apparatus comprising logic elements to perform the steps of the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In an embodiment, the present techniques may be realised in the form of a data carrier having functional data thereon, said functional data comprising functional computer data structures to, when loaded into a computer system or network and operated upon thereby, enable said computer system to perform all the steps of the above-described method.

In the preceding description, various embodiments of claimed subject matter have been described. For purposes of explanation, specifics, such as amounts, systems and/or configurations, as examples, were set forth. In other instances, well-known features were omitted and/or simplified so as not to obscure claimed subject matter.

While certain features have been illustrated and/or described herein, many modifications, substitutions, changes and/or equivalents will now occur to those skilled in the art.

It is, therefore, to be understood that the appended claims are intended to cover all modifications and/or changes as fall within claimed subject matter.

The invention claimed is:

1. A logic gate for an adaptive voltage scaling monitor, the logic gate comprising:
    a first N-type metal-oxide semiconductor (NMOS) component having a number of fingers, each finger including a transistor gate;
    a second NMOS component, coupled to the first NMOS component, having a transistor gate;
    a first P-type metal-oxide semiconductor (PMOS) component having a number of fingers, each finger including a transistor gate;
    a second PMOS component, coupled to the first PMOS component, having a transistor gate;
    a first input directly coupled to the transistor gates of the first NMOS component and the transistor gates of the first PMOS component, the first input configured to provide an input signal; and
    a second input directly coupled to the transistor gate of the second NMOS component and the transistor gate of the second PMOS component, the second input configured to provide an enable signal,
    wherein the first NMOS component, the second NMOS component, the first PMOS component, and the second PMOS component are configured to provide an inverting output based on the input signal,
    wherein the number of fingers of the first NMOS component is greater than or less than the number of fingers of the first PMOS component to provide an imbalance between a drive strength of the first NMOS component and the first PMOS component, and
    wherein the imbalance is operable to cause a switching delay of the logic gate to be primarily dependent on one of the first NMOS component or the first PMOS component.

2. The logic gate of claim 1, wherein the logic gate comprises a NAND gate.

3. The logic gate of claim 1, wherein the logic gate comprises a NOR gate.

4. A delay monitor for adaptive voltage scaling, the delay monitor comprising:
    a first set of logic gates as claimed in claim 1; and
    a second set of logic gates as claimed in claim 1.

5. The delay monitor of claim 4, wherein the switching delay of the first set is primarily dependent on the respective NMOS components of the first set being weaker than the respective PMOS components thereof.

6. The delay monitor of claim 4, wherein the switching delay of the second set is primarily dependent on the respective PMOS components of the second set being weaker than the respective NMOS components thereof.

7. The delay monitor of claim 4, wherein the first set of logic gates are configured as a first ring oscillator.

8. The delay monitor of claim 7, wherein the second set of logic gates are configured as a second ring oscillator.

9. A method of adaptive voltage scaling for an integrated circuit, the method comprising:
    monitoring, with a delay monitor as claimed in claim 4, a performance characteristic of PMOS and NMOS components on the integrated circuit;
    setting a supply voltage at the integrated circuit in response to the monitored performance characteristic.

10. The method of claim 9, wherein the performance characteristic comprises at least one of: a switching delay and frequency.

11. The method of claim 9, wherein monitoring the performance characteristic comprises measuring the time for the pull-down transitions of first NMOS components of a first set of logic gates.

12. The method of claim 11, wherein monitoring the performance characteristic comprises measuring the time for the pull-up transitions of first PMOS components of a second set of logic gates.

13. The method of claim 12, comprising:
    measuring, using two or more digital counters, the time for the respective pull-up and pull-down transitions within a sample period.

14. The method according to claim 9, wherein setting a supply voltage comprises: adjusting the supply voltage to maintain the specified performance characteristic.

15. The delay monitor according to claim 4, wherein each logic gate in the first set of logic gates comprises a NAND gate, and each logic gate in the second set of logic gates comprises a NAND gate.

16. The method according to claim 9, wherein each logic gate in the first set of logic gates comprises a NAND gate, and each logic gate in the second set of logic gates comprises a NAND gate.

17. The logic gate of claim 1, wherein the second input is directly coupled to gates associated with the second NMOS component of the logic gate and gates associated with the second PMOS component of the same logic gate.

18. The method according to claim 9, wherein the second input is directly coupled to gates associated with the second NMOS component of the logic gate and gates associated with the second PMOS component of the same logic gate.

* * * * *